United States Patent
Huang et al.

(10) Patent No.: US 7,205,217 B2
(45) Date of Patent: Apr. 17, 2007

(54) METHOD FOR FORMING TRENCH GATE DIELECTRIC LAYER

(75) Inventors: Min-San Huang, Hsinchu (TW); Hann-Jye Hsu, Taichung County (TW); Liang-Chuan Lai, Hsinchu County (TW)

(73) Assignee: Powerchip Semiconductor Corp., Hsinchu (TW)

( * ) Notice: Subject to any disclaimer, the term of this patent is extended or adjusted under 35 U.S.C. 154(b) by 118 days.

(21) Appl. No.: 11/161,177

(22) Filed: Jul. 26, 2005

(65) Prior Publication Data

US 2006/0160306 A1 Jul. 20, 2006

(30) Foreign Application Priority Data

Jan. 17, 2005 (TW) .............................. 94101265 A

(51) Int. Cl.
*H01L 21/28* (2006.01)
*H01L 21/285* (2006.01)

(52) U.S. Cl. ............. 438/589; 257/330; 257/332; 257/E21.192; 257/E21.193; 438/762; 438/763

(58) Field of Classification Search ............. 438/589, 438/270, 259, 762, 763; 257/E21.191, E21.192, 257/E21.193, 330, 332
See application file for complete search history.

(56) References Cited

U.S. PATENT DOCUMENTS

| 6,503,815 | B1 * | 1/2003 | Hsu .................... 438/452 |
|---|---|---|---|
| 6,800,899 | B2 * | 10/2004 | Gonzalez ................ 257/330 |
| 6,855,588 | B1 * | 2/2005 | Liao et al. ............... 438/197 |
| 6,967,136 | B2 * | 11/2005 | Akatsu et al. ............ 438/243 |
| 6,974,743 | B2 * | 12/2005 | Divakaruni et al. ....... 438/238 |
| 7,041,556 | B2 * | 5/2006 | Gonzalez ................ 438/259 |
| 7,067,377 | B1 * | 6/2006 | Park et al. .............. 438/270 |
| 2003/0027403 | A1 * | 2/2003 | Hsu ..................... 438/424 |
| 2003/0040189 | A1 * | 2/2003 | Chang et al. ............. 438/700 |
| 2005/0008790 | A1 * | 1/2005 | Kapoor et al. ............ 427/569 |
| 2005/0026382 | A1 * | 2/2005 | Akatsu et al. ............ 438/386 |
| 2005/0116300 | A1 * | 6/2005 | Hieda et al. ............. 257/374 |
| 2005/0153490 | A1 * | 7/2005 | Yoon et al. .............. 438/164 |
| 2005/0167741 | A1 * | 8/2005 | Divakaruni et al. ....... 257/328 |
| 2005/0266655 | A1 * | 12/2005 | Nemani et al. ........... 438/435 |
| 2006/0051926 | A1 * | 3/2006 | Jeong et al. ............. 438/296 |
| 2006/0073661 | A1 * | 4/2006 | Lee ..................... 438/296 |
| 2006/0110884 | A1 * | 5/2006 | Wang et al. ............. 438/270 |

FOREIGN PATENT DOCUMENTS

TW 511186 11/2002

* cited by examiner

*Primary Examiner*—M. Wilczewski
(74) *Attorney, Agent, or Firm*—Jiang Chyun IP Office

(57) ABSTRACT

A method for forming a trench gate dielectric layer is described. First, a substrate having a trench therein is provided. An in-situ steam generated oxidation process is performed to form a sacrificial layer on the surface of the trench. Then, the sacrificial layer is removed. Next, a low-pressure chemical vapor deposition is performed to form a gate dielectric layer on the surface of the trench.

19 Claims, 4 Drawing Sheets

METHOD FOR FORMING TRENCH GATE DIELECTRIC LAYER

CROSS-REFERENCE TO RELATED APPLICATION

This application claims the priority benefit of Taiwan application serial no. 94101265, filed on Jan. 17, 2005. All disclosure of the Taiwan application is incorporated herein by reference.

BACKGROUND OF THE INVENTION

1. Field of the Invention

The present invention relates to a semiconductor fabrication process. More particularly, the present invention relates to a method for forming a trench gate dielectric layer.

2. Description of the Related Art

Transistor is one of the basic semiconductor devices commonly used in integrated circuits such as dynamic random access memory devices, flash memories and logic devices. In the fabrication of transistors, the quality of gate oxide layer is one of the critical factors that determine the ultimate electrical properties of the transistor.

FIGS. 1A through 1D are schematic cross-sectional views showing the steps for producing a conventional gate oxide layer.

First, as shown in FIG. 1A, a substrate 100 having a patterned silicon oxide layer 102 and a patterned silicon nitride layer 104 thereon is provided. Then, a trench 106 is formed in the substrate 100. The trench 106 is formed, for example, by performing an etching process using the patterned silicon oxide layer 102 and the patterned silicon nitride layer 104 as a mask to remove a portion of the substrate 100.

However, because of the effects of the aforementioned etching process on the exposed surface of the substrate 100, a portion of the surface may be damaged or become uneven after the trench-forming process. The damaged and/or uneven surface often affects the quality of subsequently formed gate oxide layer.

To reduce the defects on the surface of the substrate 100, an oxidation process is often performed to form an oxide layer 108 on the substrate 100 as shown in FIG. 1B. The oxide layer 108 is formed by performing a furnace oxidation process carried out at a temperature of about 800° C. inside a furnace.

As shown in FIG. 1C, the oxide layer 108 is removed. The method of removing the oxide layer 108 includes performing an etching process, for example. The purpose of removing the oxide layer 108 is to remove any defects in the substrate 100 along with the oxide layer 108. Hence, the aforementioned oxide layer 108 is also referred to as a sacrificial layer.

As shown in FIG. 1D, a thermal oxidation process is performed to produce a gate oxide layer 120 on the exposed substrate 100 surface of the trench 106a.

However, the aforementioned method of forming the gate oxide layer has a number of problems. In the furnace oxidation process for forming the sacrificial layer (the oxide layer 108), sharp corners (as shown in the top edge region 107 and the bottom edge region 109 in FIG. 1B) are often formed. This phenomenon will result in the production of leakage current. In addition, occurred stress may affect the substrate 100 leading to additional problems. Besides, the thickness of the gate oxide layer 120 formed by the aforementioned thermal oxidation process is unlikely to be uniform. Furthermore, the heat may damage the crystal lattice near the surface of the substrate 100 and affect the processing reliability. Moreover, a gate oxide layer 120 having an uneven thickness can easily lead to the problems of leakage current and breakdown voltage.

SUMMARY OF THE INVENTION

Accordingly, at least one objective of the present invention is to provide a method of forming a trench gate dielectric layer capable of producing a gate dielectric layer with a uniform thickness and improving the quality of the gate dielectric layer. Furthermore, the method of forming the trench gate dielectric layer also prevents problems resulting from leakage current and instability of breakdown voltage so that overall reliability of the process is improved.

To achieve these and other advantages and in accordance with the purpose of the invention, as embodied and broadly described herein, the invention provides a method of forming a trench gate dielectric layer. The method includes providing a substrate having a trench therein. An in-situ steam generated oxidation process is performed to form a sacrificial layer on the surface of the trench. Then, the sacrificial layer is removed. Thereafter, a low-pressure chemical vapor deposition is performed to form a gate dielectric layer on the surface of the trench.

According to the method of forming the trench gate dielectric layer of one preferred embodiment of the present invention, the in-situ steam generated oxidation process operates at a temperature between about 1000~1050° C., for example. The reactive gases used in the in-situ steam generated oxidation process can be hydrogen (H2) and oxygen (O2). The gas flow rate of H2/O2 is between about (0.3~0.7)/(9~10) slm, for example.

According to the aforementioned method of forming the trench gate dielectric layer of one preferred embodiment of the present invention, the sacrificial layer has a thickness between about 80~150 Å.

According to the aforementioned method of forming the trench gate dielectric layer of one preferred embodiment of the present invention, the method of removing the sacrificial layer includes performing a hydrofluoric acid (HF) dip process.

According to the aforementioned method of forming the trench gate dielectric layer of one preferred embodiment of the present invention, the gate dielectric layer is a gate oxide layer. Furthermore, the gate oxide layer is a silicon oxide layer, for example. In addition, the gate dielectric layer has a thickness between about 70~135 Å, for example.

According to the aforementioned method of forming the trench gate dielectric layer of one preferred embodiment of the present invention, the reactive gases in the low-pressure chemical vapor deposition can be dichlorosilane (SiH2Cl2) and nitrous oxide (N2O). The gas flow rate of the reactive gases SiH2Cl2/N2O in the low-pressure chemical vapor deposition is set between (150~200)/(250~350) sccm. Furthermore, the reactive gases are set to a temperature between 700~850° C. and a pressure between 0.2~0.35 torr.

According to the aforementioned method of forming the trench gate dielectric layer of one preferred embodiment of the present invention, a thermal treatment is also carried out after forming the gate dielectric layer. The thermal treatment is a rapid thermal oxidation annealing process, for example. The rapid thermal oxidation annealing process is carried out at a reactive temperature of between 950~1100° C. using reactive gases including nitric oxide (NO) and oxygen (O2), for example. The gas flow rate of the reactive gases NO/O2 is between (0.4~0.6)/(1~3) slm and the reaction time is between 10~60 seconds.

In the present invention, an in-situ steam generated oxidation process is used to form a sacrificial layer having better edge-rounding and stress-reducing properties. In addition, the thickness of the gate dielectric layer has a high degree of uniformity. Hence, the present invention is able to reduce leakage current, increase breakdown voltage and improve process reliability.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
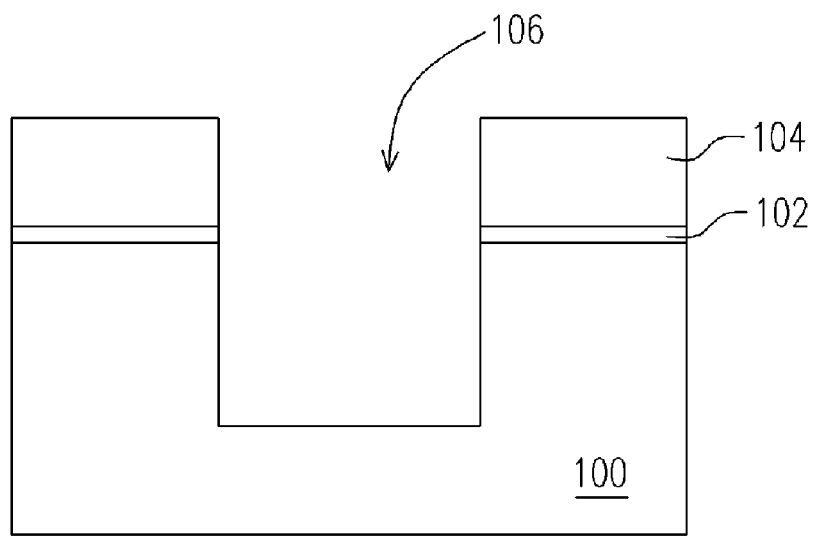
FIGS. 1A through 1D are schematic cross-sectional views showing the steps for producing a conventional gate oxide layer.
Figure 1B:
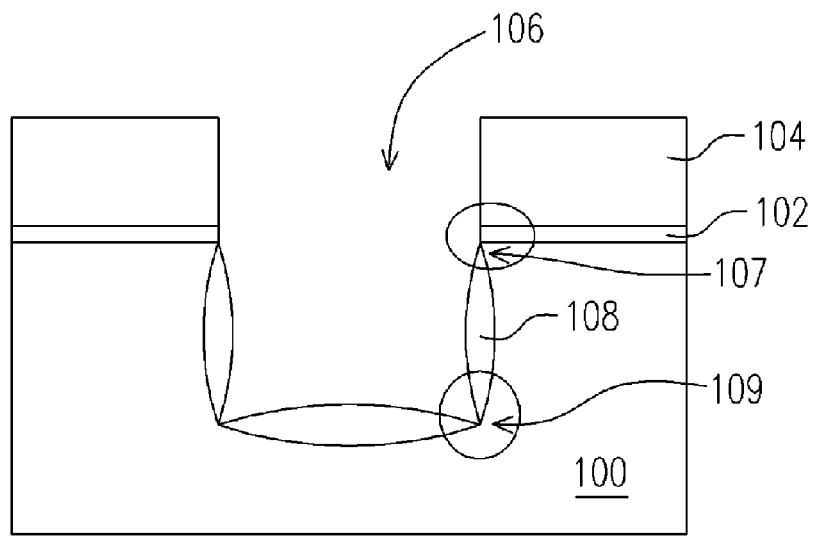
Figure 1C:
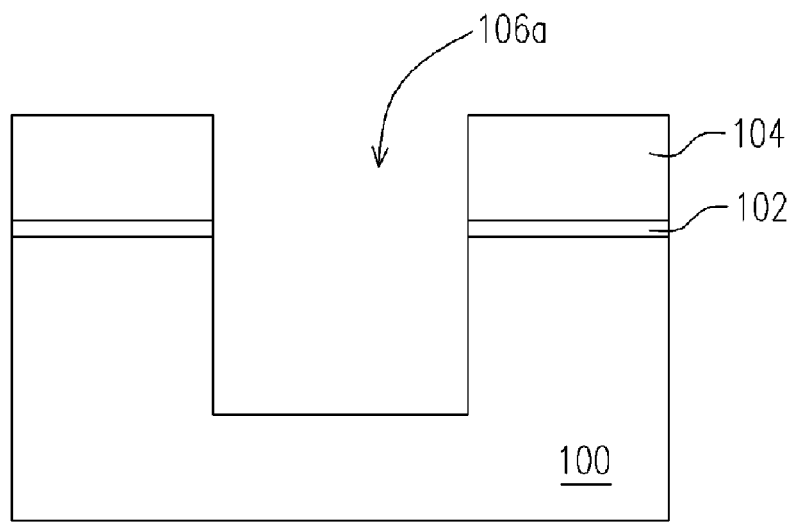
Figure 1D:
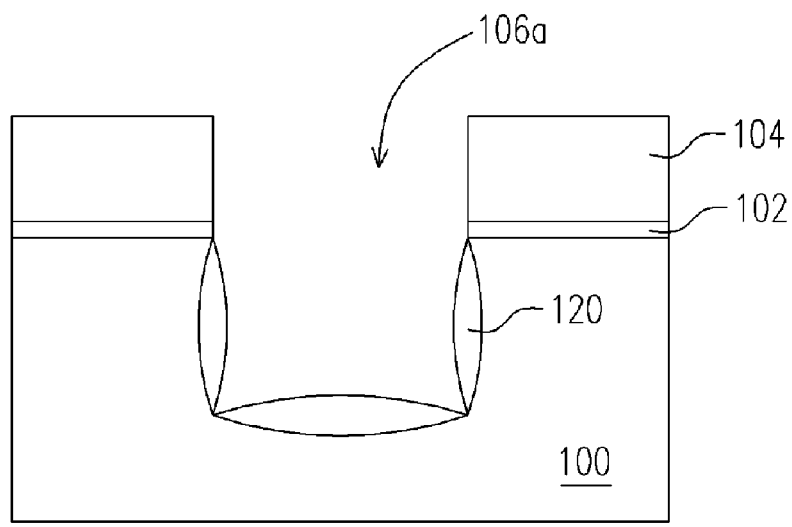

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2D are schematic cross-sectional views showing the steps for producing a trench gate dielectric layer according to one preferred embodiment of the present invention.

Figure 2A:
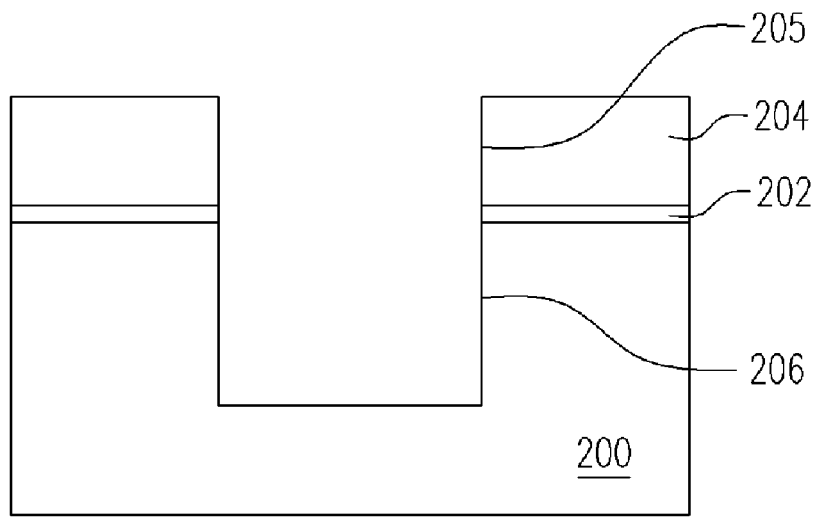
FIGS. 2A through 2D are schematic cross-sectional views showing the steps for producing a trench gate dielectric layer according to one preferred embodiment of the present invention.

First, as shown in FIG. 2A, a substrate 200 is provided. Then, a dielectric layer 202 and an insulating layer 204 are sequentially formed over the substrate 200. Then, the dielectric layer 202 and the insulating layer 204 are patterned to form an opening 205, and the bottom of the opening 205 exposes a portion of the substrate 200. Using the dielectric layer 202 and the insulating layer 204 as a mask, a photolithographic and etching process is carried out to remove a portion of the substrate 200 and form a trench 206. The substrate 200 is a silicon substrate, the material of the dielectric layer 202 is silicon oxide and the material of the insulating layer 204 is silicon nitride, for example.

Figure 2B:
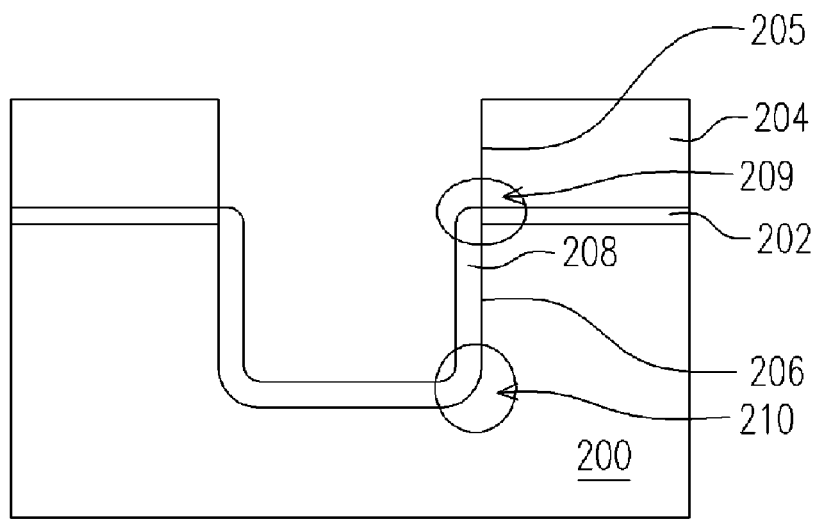

As shown in FIG. 2B, an in-situ steam generated (ISSG) oxidation process is performed to form a sacrificial oxide layer 208 on the surface of the trench 206. The sacrificial oxide layer has a thickness between 80~150 Å, for example. Furthermore, the ISSG oxidation process is carried out at a temperature between 1000~1050° C. using reactive gases such as hydrogen (H2) and oxygen (O2) having a flow rate H2/O2 of between (0.3~0.7)/(9~10) slm.

The steam generated in the aforementioned ISSG oxidation process will react with the exposed substrate 200 of the trench 206 to form an oxide layer on the trench surface. Most of the defects or damages produced on the exposed substrate 200 of the trench 206 after the aforementioned etching process can be repaired through the formation of the oxide layer. Therefore, the oxide layer is also called a sacrificial oxide layer 208. Furthermore, aside from reacting with the exposed substrate 200 of the trench 206, the ISSG oxidation process will also react with the sidewalls of the opening 205. Thus, the top edge region 209 and the bottom edge region 210 will be rounded through the oxidation of silicon, the so-called corner rounding process.

Accordingly, since the sacrificial oxide layer 208 formed in the ISSG oxidation process is capable of rounding the edges and reducing stress, the ISSG oxidation process facilitates subsequent fabrication processes. Furthermore, the conventional furnace oxidation process often demands many hours to fabricate a film layer. The ISSG oxidation process has the advantages of high-temperature and fast reaction. Hence, using the ISSG oxidation process can save a lot of processing time as well as production cost.

Figure 2C:
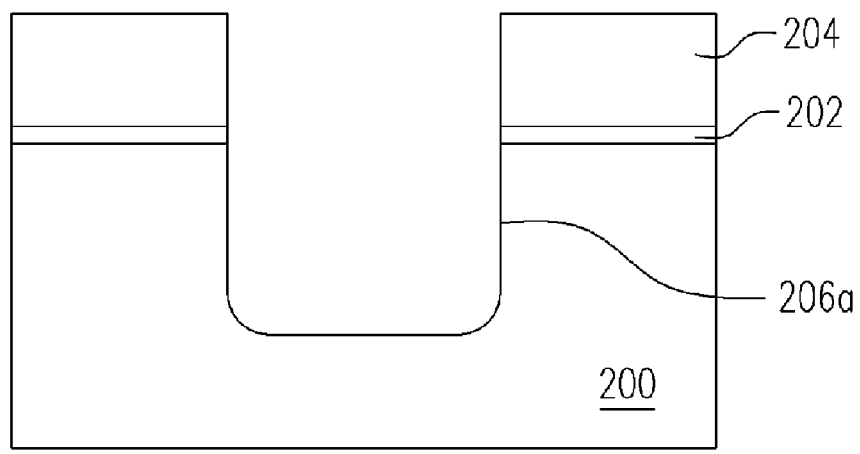

As shown in FIG. 2C, the sacrificial oxide layer 208 is removed to form a trench 206a. The method of removing the sacrificial oxide layer 208 includes performing an HF dip process. The aforementioned process of removing the oxide layer 208 also eliminates any defective portion of the substrate 200 from the surface so that the substrate 200 is defect-free again.

Figure 2D:
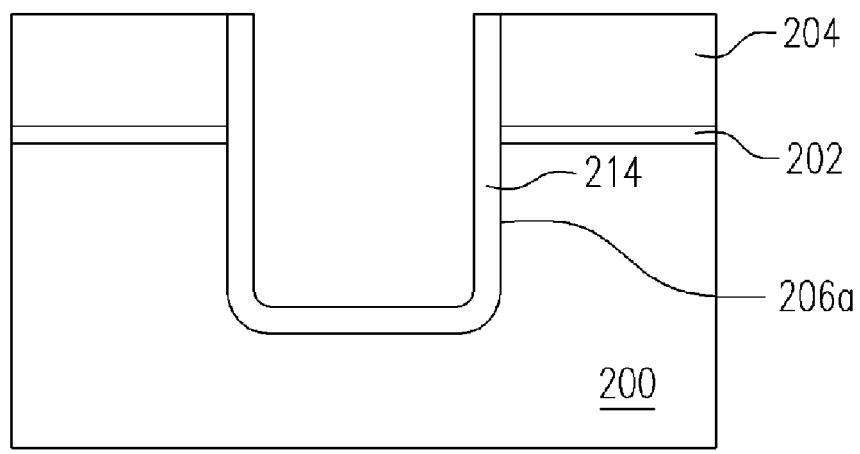

As shown in FIG. 2D, a low-pressure chemical vapor deposition process is carried out to form a gate dielectric layer 214 on the trench 206a surface. The gate dielectric layer 214 is a gate oxide layer fabricated from silicon oxide, for example. Using a silicon oxide gate dielectric layer 214 as an example, the low-pressure chemical vapor deposition is carried out using dichlorosilane (SiH2Cl2) and nitrous oxide (N2O) as the reactive gases. The gas flow rate of the reactive gases SiH2Cl2/N2O is between (150~200)/(250~350) sccm. In addition, the temperature for performing the low-pressure chemical vapor deposition process is set between 700~850° C. and the pressure for performing the low-pressure chemical vapor deposition process is set between about 0.2~0.35 torr. Furthermore, the gate dielectric layer 214 has a thickness between about 70~135 Å.

In another embodiment, a thermal treatment process is also performed after forming the gate dielectric layer 214. The thermal treatment is a rapid thermal oxidation annealing process, for example. The rapid thermal oxidation annealing process is carried out using reactive gases such as nitric oxide (NO) and oxygen (O2). The process is performed at a temperature between 950~1100° C. with a gas flow rate of the NO/O2 between (0.4~0.6)/(1~3) slm for a total reaction period of about 10~60 seconds. The aforementioned thermal treatment is able to increase the density of the gate dielectric layer 214. Hence, the quality of the gate dielectric layer 214 is improved to facilitate subsequent processing operations.

It should be noted that the trench gate dielectric layer of the present invention could be applied in many areas such as trench type memories, trench type semiconductor devices and trench type capacitors. In particular, because the gate dielectric layer fabricated according to the present invention has a highly uniform thickness, the reliability of data retention in memories is significantly improved.

In summary, major advantages of the present invention includes as follows.

1. An in-situ steam generated oxidation process is used to form a sacrificial layer having better edge-rounding and stress-reducing properties so that subsequent fabrication processes are facilitated.

2. A low-pressure chemical vapor deposition process is used to form a gate dielectric layer having a uniform thickness so that the overall quality of the gate dielectric layer is improved. Ultimately, the leakage current is reduced and the breakdown voltage and process reliability is increased.

3. The method can be used in many applications. In particular, when the method is applied to fabricate a memory, the data retention capacity is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a trench gate dielectric layer, comprising:
    providing a substrate having a trench therein;
    performing an in-situ steam generated (ISSG) oxidation process to form a sacrificial oxide layer on the surface of the trench;
    removing the sacrificial oxide layer; and
    performing a low-pressure chemical vapor deposition process to form a gate dielectric layer on the surface of the trench.

2. The method of claim 1, wherein the in-situ steam generated oxidation process is carried out at a temperature between 1000~1050° C.

3. The method of claim 1, wherein the reactive gases used in the in-situ steam generated oxidation process include hydrogen (H2) and oxygen (O2).

4. The method of claim 3, wherein the gas flow rate of H2/O2 in the in-situ steam generated oxidation process is between (0.3~0.7)/(9~10) slm.

5. The method of claim 1, wherein the sacrificial oxide layer has a thickness between 80~150 Å.

6. The method of claim 1, wherein the step of removing the sacrificial oxide layer comprises performing a hydrofluoric acid (HF) dip process.

7. The method of claim 1, wherein the gate dielectric layer comprises a gate oxide layer.

8. The method of claim 7, wherein the material of the gate oxide layer comprises silicon oxide.

9. The method of claim 8, wherein the reactive gases used in the low-pressure chemical vapor deposition process include dichlorosilane (SiH2Cl2) and nitrous oxide (N2O).

10. The method of claim 9, wherein the gas flow rate of the reactive gases SiH2Cl2/N2O in the low-pressure chemical vapor deposition process is between (150~200)/(250~350) sccm.

11. The method of claim 8, wherein the low-pressure chemical vapor deposition process is carried out at a temperature between 700~850° C.

12. The method of claim 8, wherein the low-pressure chemical vapor deposition process is carried out at a pressure between 0.2~0.35 torr.

13. The method of claim 8, wherein the gate dielectric layer has a thickness between 70~135 Å.

14. The method of claim 1, wherein after forming the gate dielectric layer, further comprises performing a thermal treatment.

15. The method of claim 14, wherein the thermal treatment includes performing a rapid thermal oxidation annealing process.

16. The method of claim 15, wherein the rapid thermal oxidation annealing process is carried out at a reacting temperature between 950~1100° C.

17. The method of claim 15, wherein the reactive gases used in the rapid thermal oxidation annealing process includes nitric oxide (NO) and oxygen (O2).

18. The method of claim 17, wherein the gas flow rate of the reactive gases NO/O2 used in the rapid thermal oxidation process is between (0.4~0.6)/(1~3) slm.

19. The method of claim 15, wherein the rapid thermal oxidation annealing process is carried out for a duration of between 10~60 seconds.

* * * * *